United States Patent
Saxena et al.

(10) Patent No.: US 10,323,980 B2
(45) Date of Patent: Jun. 18, 2019

(54) TUNABLE PHOTOCAPACITIVE OPTICAL RADIATION SENSOR ENABLED RADIO TRANSMITTER AND APPLICATIONS THEREOF

(71) Applicant: Rensselaer Polytechnic Institute, Troy, NY (US)

(72) Inventors: Tanuj Saxena, Troy, NY (US); Partha Sarathi Dutta, Clifton Park, NY (US); Serguei Lvovich Roumiantsev, Troy, NY (US); Michael Shur, Latham, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 311 days.

(21) Appl. No.: 14/780,687

(22) PCT Filed: Mar. 28, 2014

(86) PCT No.: PCT/US2014/032107
§ 371 (c)(1),
(2) Date: Sep. 28, 2015

(87) PCT Pub. No.: WO2014/160907
PCT Pub. Date: Oct. 2, 2014

(65) Prior Publication Data
US 2016/0041030 A1    Feb. 11, 2016

Related U.S. Application Data

(60) Provisional application No. 61/806,455, filed on Mar. 29, 2013.

(51) Int. Cl.
*G01J 1/46*    (2006.01)
*G01J 1/42*    (2006.01)
(Continued)

(52) U.S. Cl.
CPC ............. *G01J 1/46* (2013.01); *G01J 1/4228* (2013.01); *H01L 27/144* (2013.01); *G01J 2001/4426* (2013.01)

(58) Field of Classification Search
CPC .... G01J 1/46; G01J 1/44; G01J 1/4228; G01J 1/42; G01J 2001/4426; G01J 2001/4413; G01R 33/3692; H01L 27/144
See application file for complete search history.

(56) References Cited

U.S. PATENT DOCUMENTS 5,136,346 A * 8/1992 Kornowski ........... H01L 31/103
                                                    257/461
6,236,205 B1 * 5/2001 Ludeke ................... A61B 5/06
                                                    324/300

(Continued)

FOREIGN PATENT DOCUMENTS

WO         9429960 A1    12/1994
WO      2006097888 A1     9/2006

OTHER PUBLICATIONS

International Search Report and Written Opinion for PCT/US2014/032107, dated Aug. 20, 2014, 8 pages.

*Primary Examiner* — John R Lee
(74) *Attorney, Agent, or Firm* — Murtha Cullina LLP; Anthony P. Gangemi

(57) ABSTRACT

A sensor system, device and method for generating a wireless signal in response to a sensed illumination. A sensor is disclosed having: a photosensitive element; a device that converts a sensed illumination detected by the photosensitive element into a corresponding impedance response; and a wireless signal generator that generates a wireless output based on a characteristic of the corresponding impedance response, wherein the wireless output correlates to the sensed illumination.

18 Claims, 14 Drawing Sheets

(51) Int. Cl.
  *H01L 27/144* (2006.01)
  *G01J 1/44* (2006.01)

(56) References Cited

U.S. PATENT DOCUMENTS

| | | | | |
|---|---|---|---|---|
| 7,162,293 B2* | 1/2007 | Weiss | A61B 5/06 | 600/411 |
| 7,679,057 B2* | 3/2010 | Gritz | G01J 5/08 | 250/338.1 |
| 7,742,799 B2* | 6/2010 | Mueller | A61B 5/055 | 324/304 |
| 7,888,934 B2* | 2/2011 | Fukuchi | G01R 33/3415 | 324/307 |
| 8,007,167 B2* | 8/2011 | Cummins | G01N 27/223 | 257/506 |
| 8,115,683 B1* | 2/2012 | Stefanakos | H01Q 1/248 | 136/255 |
| 8,269,683 B2* | 9/2012 | McKinzie | H01Q 9/0407 | 343/745 |
| 8,405,467 B2* | 3/2013 | He | H03H 7/40 | 333/17.3 |
| 8,507,955 B2* | 8/2013 | Cummins | G01N 27/121 | 257/252 |
| 8,596,862 B1* | 12/2013 | Pfeifer | G01K 11/265 | 374/117 |
| 8,598,874 B2* | 12/2013 | Saes | G01R 33/3614 | 324/307 |
| 8,639,195 B2* | 1/2014 | Christensen | H04B 1/0458 | 361/91.1 |
| 8,836,439 B2* | 9/2014 | O'Hara | H01P 7/08 | 331/107 DP |
| 9,201,442 B2* | 12/2015 | Gupta | G05F 3/16 | |
| 9,476,975 B2* | 10/2016 | Viikari | G01S 13/75 | |
| 9,488,705 B2* | 11/2016 | Reykowski | G01R 33/3628 | |
| 9,508,488 B2* | 11/2016 | Vendik | H01F 38/14 | |
| 2003/0073898 A1* | 4/2003 | Weiss | A61B 5/06 | 600/410 |
| 2003/0088181 A1* | 5/2003 | Gleich | A61B 5/055 | 600/434 |
| 2004/0124838 A1* | 7/2004 | Duerk | G01R 33/285 | 324/304 |
| 2005/0142662 A1* | 6/2005 | Bonne | B82Y 15/00 | 436/149 |
| 2008/0157762 A1* | 7/2008 | Weiss | G01R 33/34046 | 324/304 |
| 2010/0008825 A1* | 1/2010 | Subramanyam | G01N 27/221 | 422/82.02 |
| 2016/0041030 A1* | 2/2016 | Saxena | H01L 27/144 | 250/208.2 |

* cited by examiner

TUNABLE PHOTOCAPACITIVE OPTICAL RADIATION SENSOR ENABLED RADIO TRANSMITTER AND APPLICATIONS THEREOF

PRIORITY CLAIM

This application claims priority to U.S. Provisional Application Ser. No. 61/806,455, filed on Mar. 29, 2013, entitled "Tunable Photocapacitive Optical Radiation Sensor Enabled Radio Transmitter and Applications Thereof," the content of which are hereby incorporated by reference.

BACKGROUND

1. Technical Field

The present invention relates generally to a tunable photocapacitive optical sensor and related system that emits a radio wave having characteristics dependent on the intensity, wavelength and the modulation speed of the incident optical radiation.

2. Related Art

Wireless, highly sensitive and large area optical sensor arrays with smart control covering a wide dynamic range, high speed and high color resolution are required in numerous applications including energy efficient smart lighting, dynamic color tunable lighting, bio-chemical detection, medical imaging, machine automation, surveillance, communication nodes, computing, etc.

Conventional optical sensors are not inherently wireless and complex circuitry is required to make their operation wireless. Moreover, the cost of fabrication of sensor arrays is high as the technology is not scalable to large dimensions.

SUMMARY

Disclosed are a system, method and device that convert sensed illumination into a corresponding impedance (e.g., capacitance, inductance, etc.). The resulting impedance can then be easily integrated into a wireless signal generator (e.g., an LC or tank circuit), such that a characteristic of the illumination (e.g., intensity, wavelength, etc.) can be translated into a wireless output.

One embodiment discloses a novel device design and system that incorporates photocapacitive principles which when coupled into a radio or terahertz frequency oscillator circuit generates radio or terahertz waves. Such frequency could, e.g., vary from 10 kHz to 30 THz. Designs and methods for fabricating a tunable photocapacitive optical sensor are disclosed where the device capacitance is changed in response to a change in at least one of the following: the intensity, wavelength, spectral power distribution, polarization, incidence angle and modulation speed of the light illuminating the sensor are presented. A sensor device can be installed in a resonant (i.e., tank) circuit to create a radio wave that can transfer the information via a wireless mode to a node that is used for controlling a system of interest. The characteristics of the radio wave emitted are dependent on the intensity, wavelength and the modulation speed of the incident optical radiation presented to the sensor.

The photocapacitive sensor system described herein is inherently capable of wireless operation with simple circuitry which not only reduces the cost but also improves energy efficiency and ensures a smart control over a wide and tunable dynamic range. Such a sensor design can be easily extended to large area fabrication technologies, bringing down the cost of production and technologies based on flexible materials as well as integrated circuit designs. These features allow this design to be highly versatile without trading with the cost of production and operation.

In a first aspect, the invention provides an optical sensor system, comprising: at least one photosensitive element; and at least two passive elements connected via the at least one photosensitive element; wherein each passive element outputs a measurable impedance response based on a characteristic of a light source striking the at least one photosensitive element.

In a second aspect, the invention provides a sensor, comprising: a network of photosensitive elements; pairs of passive elements, each pair connected via one of said photosensitive elements for converting a sensed illumination detected by the photosensitive element into a corresponding impedance response; and a wireless signal generator that generates a wireless output based on a characteristic of the corresponding impedance response, wherein the wireless output correlates to the sensed illumination.

In a third aspect, the invention provides a method for implementing a sensor, comprising:
providing at least one photosensitive element; providing at least one pair of impedance elements coupled via the at least one photosensitive element; providing a wireless signal generator that integrates with at least one of the impedance elements; generating an impedance response on each impedance element in response to a sensed illumination detected by the at least one photosensitive element; and generating a wireless output from the wireless signal generator based on a characteristic of the impedance, wherein the wireless output correlates to the sensed illumination.

BRIEF DESCRIPTION OF THE DRAWINGS

These and other features of this invention will be more readily understood from the following detailed description of the various aspects of the invention taken in conjunction with the accompanying drawings in which.

Figure 1:
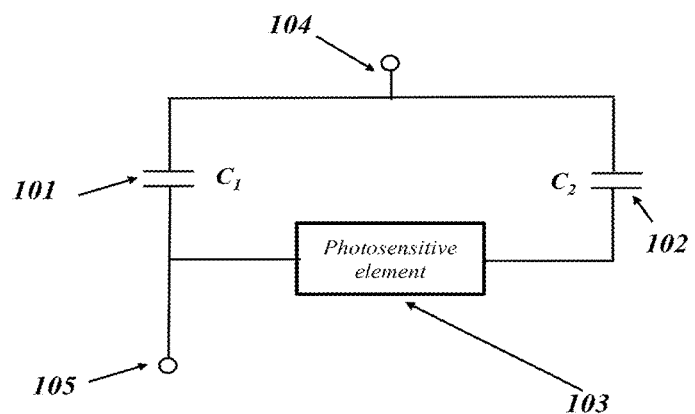
FIG. 1 depicts a circuit directed to a device for converting a sensed illumination into a corresponding impedance according to embodiments of the present invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Described herein is a system that converts sensed illumination into a corresponding impedance (e.g., capacitance, inductance, etc.). The resulting impedance can then be easily integrated into a wireless signal generator (e.g., an LC or tank circuit), such that a characteristic of the illumination (e.g., intensity, wavelength, etc.) can be translated into a wireless output.

FIG. 1 shows a schematic of a proposed device structure for converting a sensed illumination into corresponding impedance, in this case, capacitance. The structure consists of two capacitive elements 101 and 102 connected via at least one photosensitive element 103. The photosensitive element responds to illumination and the coupling between the two capacitances changes, which results in a change in the capacitance between the nodes 104 and 105, which is the quantity of interest. Note that although the invention is generally described as a structure for outputting a change in capacitance, such a structure could be implemented utilizing any type of passive element that can output an impedance response, e.g., an inductance.

Figure 2:
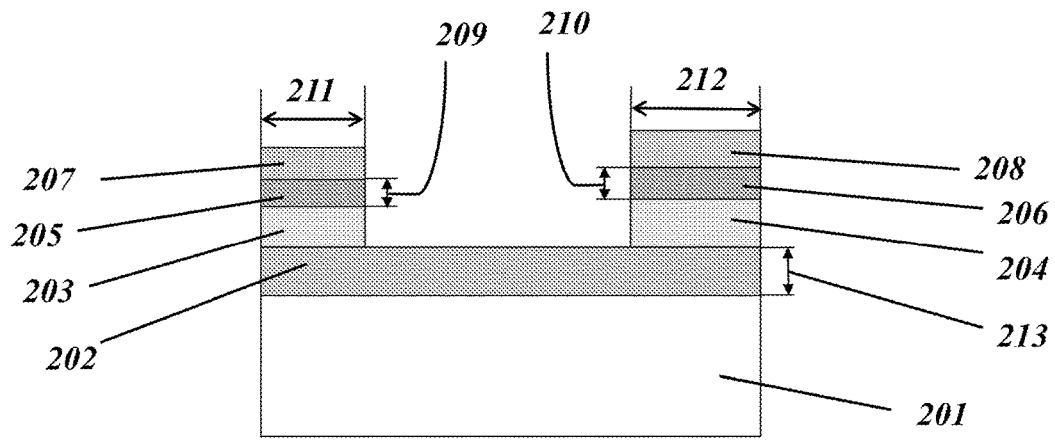
FIG. 2 depicts a monolithically formed semiconductor structure according to embodiments of the invention.

Such a structure can be monolithically formed using a semiconductor as the photosensitive material and an example is shown in FIG. 2. The structure consists of a layer of a semiconductor 202, deposited on a substrate 201. The semiconducting layer 202 acts as the active layer of the device. On top of the semiconducting layer, two metal electrodes 203 and 204 are deposited. These metal electrodes are covered with layers of dielectric material(s) 205 and 206. These dielectric layers are further covered with metal layers 207 and 208. The respective metals and dielectric layers can be fabricated from either same or different materials. In all cases, two geometric capacitive structures are formed by the two metal-dielectric-metal stacks 207-205-203 and 208-206-204. These two capacitive structures are connected through the semiconducting layer 202. Under the proposed operation of the device, the top metal plates, 207 and 208, of the two geometric capacitors are kept at the same potential. The quantity of interest is the capacitance between electrodes 207 and 203 (or 208 and 204). This capacitance is also referred to as the device capacitance in the following discussion. When the device is illuminated with light of photon energy higher the band gap of the semiconductor layer 202, electron-hole pairs are generated in the layer, which reduce the resistivity of the layer and hence the coupling between the two geometric capacitors changes. This results in a change in the device capacitance. Different illumination intensities correspond to different resistivities of the semiconductor layer and hence different values of device capacitance.

Figure 3:
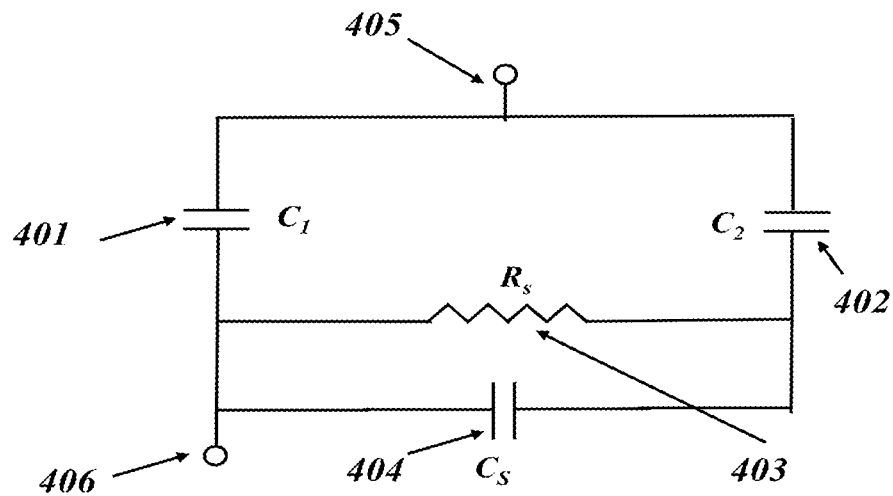
FIG. 3 depicts a circuit model of the structure of FIG. 2.

This device can be modeled by a simple circuit shown in FIG. 3. This model includes the two geometric capacitances 401 and 402 with values $C_1$ and $C_2$ respectively, which are independent of illumination, corresponding to the metal-dielectric-metal stacks 207-205-203 and 208-206-204, the resistance 403 with value $R_s$, of the semiconducting layer, and a parallel capacitance 404 with value $C_s$, corresponding to the capacitance between the electrodes 203 and 204. Using this model, the limits of the device capacitance can be estimated. Under dark conditions, when the resistance of the semiconductor, $R_s$, is extremely high, infinite in the limit, the device capacitance is given by, $$C_p = C_1 + \frac{C_2 C_s}{C_2 + C_s}$$

and under intense illumination, when the semiconductor resistance approaches zero, the device capacitance in the limit is given by, $$C_p = C_1 + C_2$$

where $C_1$ and $C_2$ can be calculated using the thickness and dielectric constant of the dielectric layers 205 and 206 and the areas of the metal pads 203 and 204.

Figure 4:
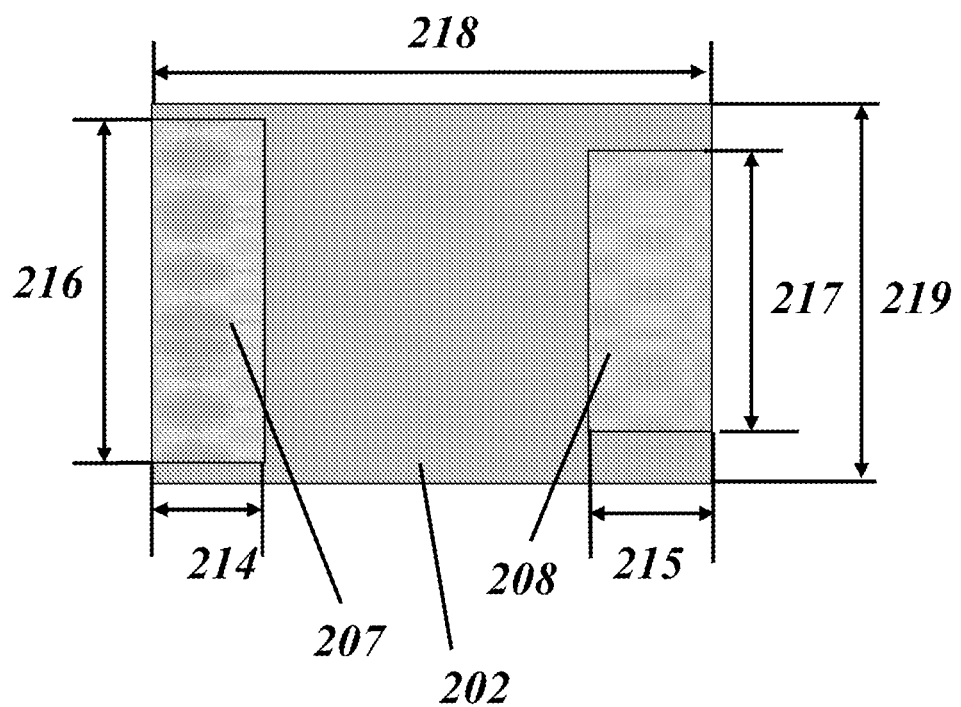
FIG. 4 depicts a top view of the structure of FIG. 2 according to embodiments of the invention.

The different critical dimensions of the device are shown in FIGS. 2 and 4. These are the dimensions of the metal pads forming the capacitive stacks at the two ends of the semiconducting layer (214-217), width 219, length 218 and thickness 213 of semiconducting layer, and the thickness of the dielectric layers 205 and 206 forming the two capacitors. The capacitances 401, 402, 404 and the resistance 403 depend on these dimensions. These parameters can be changed to design the device for a desired range of device capacitances.

Figure 5:
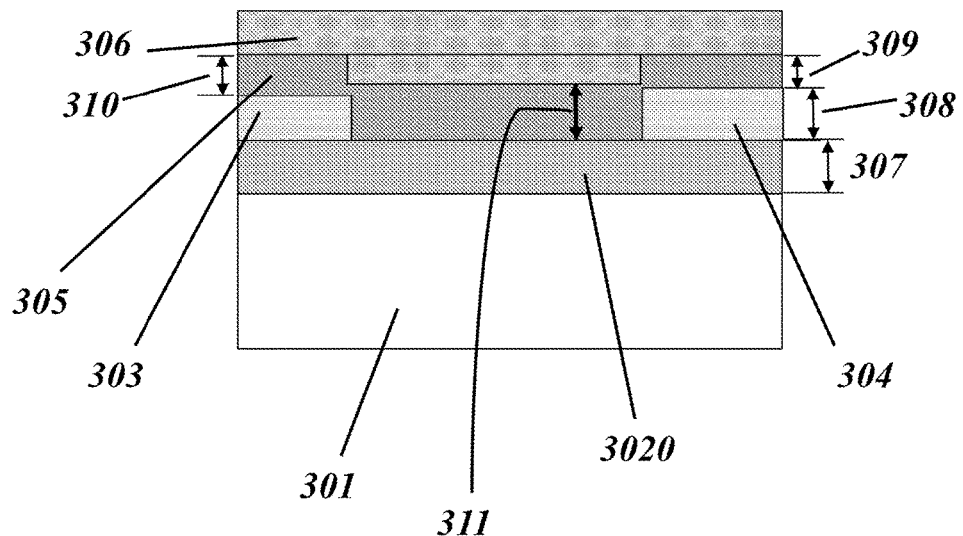
FIG. 5 depicts an alternative embodiment of the structure of FIG. 2 according to embodiments of the invention.

FIG. 5 shows a modification to the structure proposed in FIG. 2. This structure includes the dielectric layer 305, and the top metal 306, covering the entire area of the semiconductor layer 302. The semiconductor layer is deposited on substrate 301. Two metallic electrodes 303 and 304 are deposited on top of the semiconducting layer. The two geometric capacitance stacks are formed by 306-305-303 and 306-305-304. The semiconductor layer still couples these two geometric capacitances, but this structure also includes the capacitance between the top metal electrode 306 and the semiconducting layer 302. The quantity of interest is the capacitance between electrodes 306 and 303. This device capacitance carries contribution from the two geometric capacitances, the metal-dielectric-semiconductor capacitance, the capacitance between the two electrodes 303 and 304, and the resistance of the semiconducting layer 302. This device is essentially a distributive device in the metal-dielectric semiconductor region. A simplified lumped model to aid in understanding is presented in FIG. 6.

Figure 6:
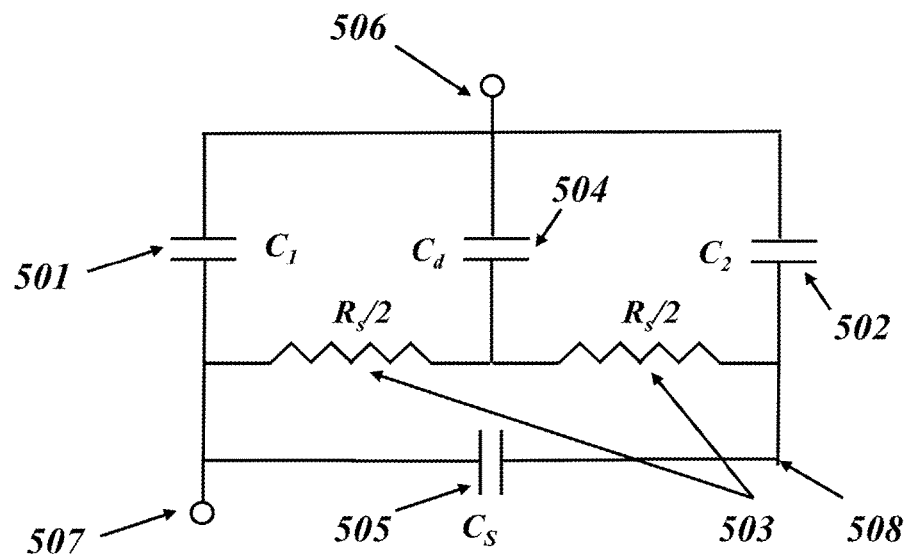
FIG. 6 depicts a circuit model of the structure of FIG. 5.

In the model shown in FIG. 6, upon illumination, in addition to the change in the semiconductor layer resistance, the capacitance between the top metal electrode and the semiconducting layer also changes. This model includes the two geometric capacitances 501 and 502 with values $C_1$ and $C_2$ respectively, which are independent of illumination, corresponding to the metal-dielectric-metal stacks by 306-305-303 and 306-305-304, the resistances 503 each with value $R_s/2$, $R_s$ being the overall resistance of the semiconducting layer, and a parallel capacitance 505, corresponding to the capacitance between the electrodes 303 and 304 and the metal-dielectric-semiconductor capacitance 504. Using this model, the limits of the device capacitance can be estimated. Under dark conditions, when the resistance of the semiconductor, $R_s$, is extremely high, infinity in the limit, the device capacitance is given by, $$C_p = C_1 + \frac{C_2 C_s}{C_2 + C_s}$$

and under intense illumination, when the semiconductor resistance approaches zero, the device capacitance in the limit is given by, $$C_p = C_1 + C_2 + C_d$$

Figure 7:
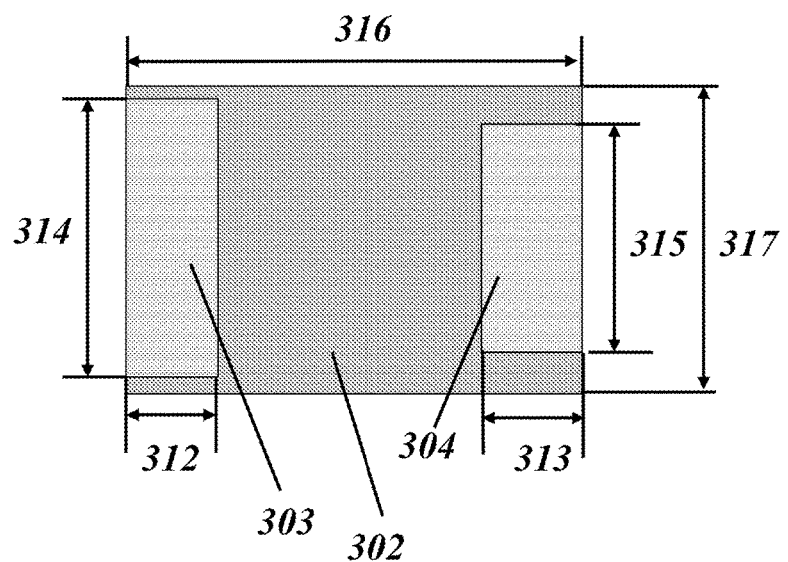
FIG. 7 depicts a top view of the structure of FIG. 5 according to embodiments of the invention.

The design parameters of this device are shown in FIG. 5 and FIG. 7 and include the dimension of the metal pads 312-315, thickness 307, length 316 and width 307 of the semiconducting layer, thicknesses of dielectric layers on top of the metal pads 309 and 310 and the thickness of dielectric layer 311 on top of the semiconducting layer.

Figure 8:
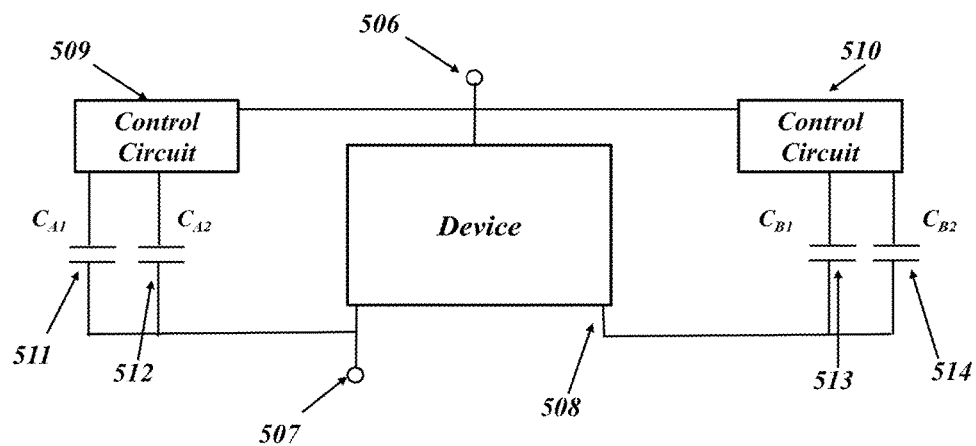
FIG. 8 depicts a device having control circuits according to embodiments of the invention.

The lower and upper limit of the device capacitance can also be modified during the operation of the device of FIG. 2 and FIG. 5 by connecting external capacitors which can be coupled to the device through a controlling circuitry. As an example, FIG. 8 shows the circuit consisting of the device from FIG. 5. External capacitors 511, 512, 513, 514 are added to the two ports of the device formed by the leads 506-507 and 506-508. These capacitors are coupled through control (e.g., dynamic range adjustment) circuits 509 and 510 respectively. The dynamic range adjustment circuits can couple or decouple these external capacitors from the device to change the lower and upper limit of the device capacitance, i.e., the capacitance between the leads 506 and 507. Such operation can be used to change the resolution, or dynamic range, of the device capacitance.

The semiconductor making layer 202 or 302 may be any one of the many semiconducting materials, Si, Ge, SiC, SiGe, AlSb, AlAs, AlN, AlP, BN, BP, BAs, GaSb, GaAs, GaN, GaP, InSb, InAs, InN, InP, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, HgCdTe, HgZnTe, HgZnSe, CuCl, $Cu_2S$, PbSe, PbS, PbTe, SnS, $SnS_2$, $Cd_3As_2$, $TiO_2$, $Cu_2O$, CuO, $SnO_2$, $BaTiO_3$, $SrTiO_3$, $LiNbO_3$, $La_2CuO_4$, GaSe, SnS, $Bi_2S_3$, GaMnAs, InMnAs, CdMnTe, PbMnTe, FeO, NiO, $AgGaS_2$, $ZnSiP_2$, $As_2S_3$, PtSi, $BiI_3$, $HgI_2$, TlBr, Se, $Ag_2S$, $FeS_2$ etc. The choice of materials forming the photosensitive layer would determine the spectral response of the device.

Figure 9:
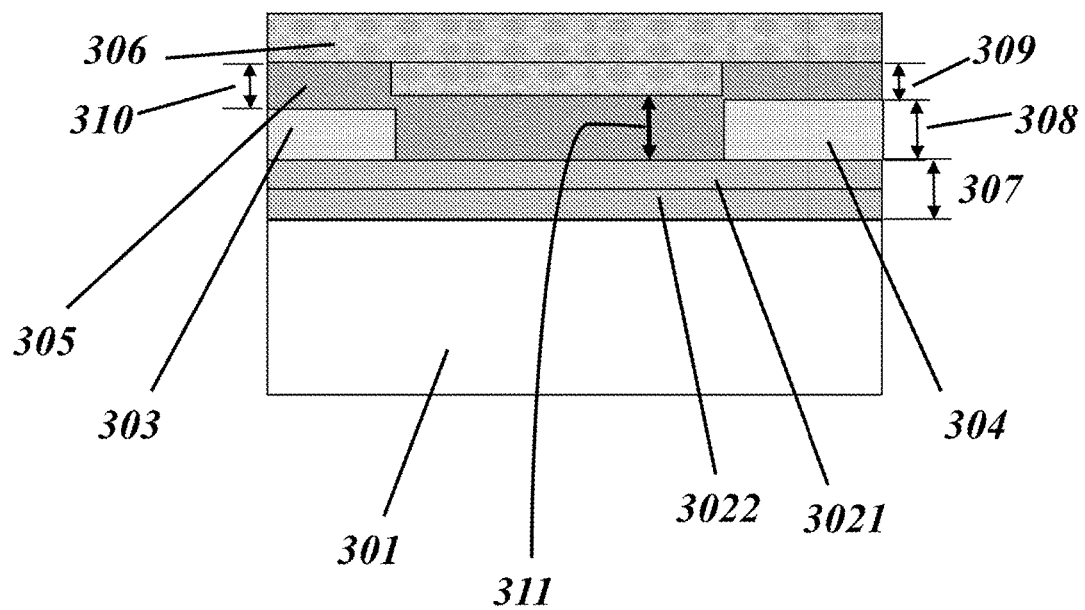
FIG. 9 depicts a device implemented with a heterostructure according to embodiments of the invention.
Figure 10:
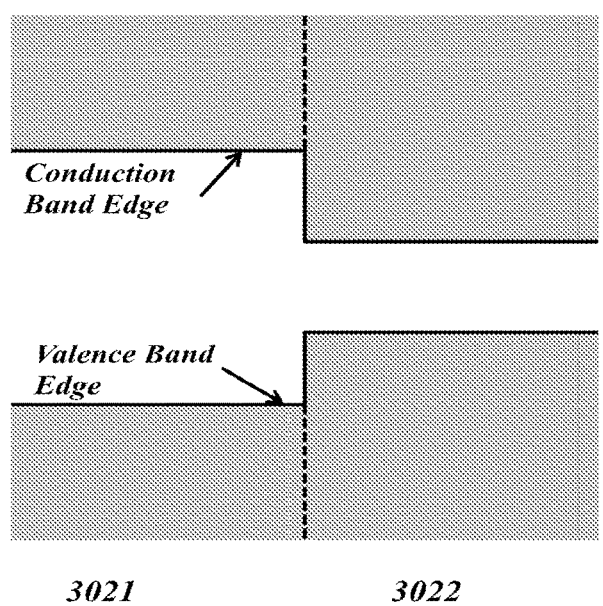
FIG. 10 depicts valence band and conduction band edges of the device of FIG. 9 according to embodiments of the invention.

Instead of a single semiconductor, the photosensitive layer 202 and 302 may be composed of a semiconductor heterostructure. For a single heterostructure, for example, two layers of different semiconductors 3021 and 3022 are stacked up as shown in FIG. 9. As a result of stacking up, the valence band and conduction band edges may suffer discontinuities at the interface of these layers, as shown in FIG. 10. Since these materials have different band gaps, light of different wavelengths may excite electron hole pairs either one or both or none of these layers. Due to the discontinuities in the conduction and valence band edges, the excited carriers may be confined in space to one particular layer. The physical location of the generated carriers decides the metal-dielectric-semiconductor capacitance and hence this capacitance value may be made to depend upon the illumination wavelength.

Figure 11:
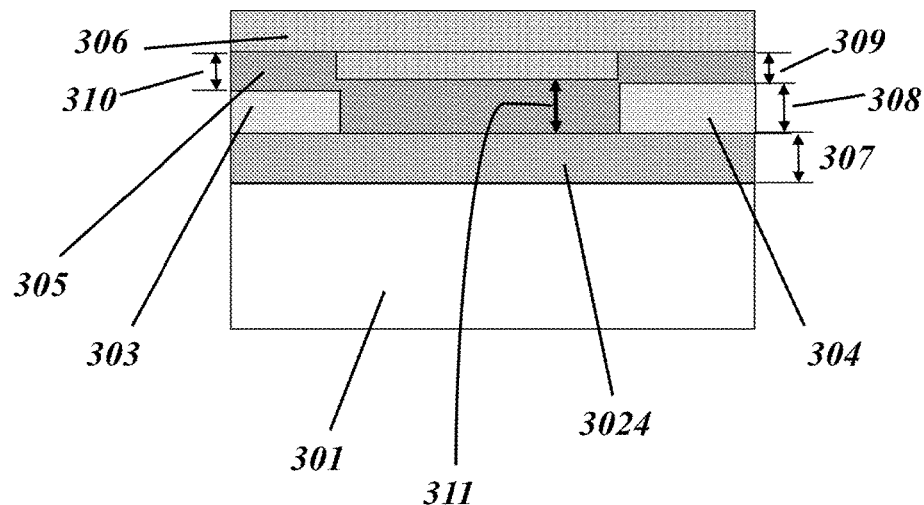
FIG. 11 depicts a structure utilizing a polycrystalline, microcrystalline or nanocrystalline semiconductor according to embodiments of the invention.

The photosensitive element can also be made of polycrystalline, microcrystalline or nanocrystalline semiconductors. Polycrystalline semiconductors are highly crystalline with different grains having different crystal orientations. On the other hand microcrystalline and nanocrystalline semiconductors have micro or nanocrystals dispersed in an amorphous matrix. FIG. 11 shows such a structure where the layer 3024 can be a polycrystalline, microcrystalline or nanocrystalline semiconductor. Similarly, the individual layers in the semiconductor heterostructure shown in FIG. 9, i.e. layers 3021 and 3022 can also be individually single crystal, polycrystalline, microcrystalline or nanocrystalline in structure. Furthermore, all these semiconductor layers can also be completely amorphous in structure. With appropriate choice of semiconductor material, structure and characteristics such as doping, the sensitivity and/or speed can be optimized.

Figure 12:
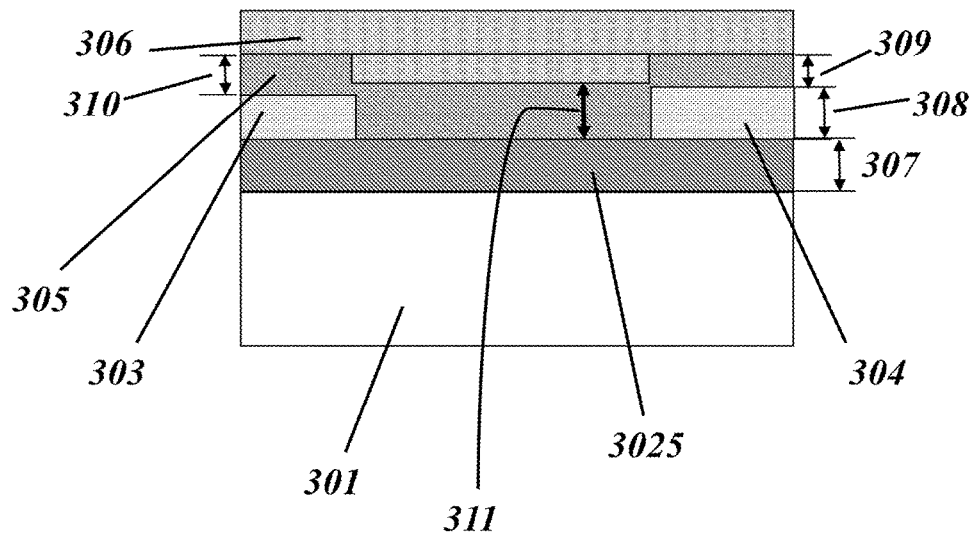
FIG. 12 depicts a structure having embedded metal nanoparticles or embedded semiconductor nanodots according to embodiments of the invention.

The photosensitive layer can also be formed by a semiconductor or a semiconductor heterostructure with crystalline, polycrystalline, microcrystalline, nanocrystalline or amorphous semiconductors with embedded metal nanoparticles or embedded semiconductor nanodots as shown in layer 3025 in FIG. 12.

Furthermore, the substrate of these device structures, 201 and 301 can be a flexible material. Different deposition techniques such as deposition from a solution could be employed for deposition of photosensitive materials on these substrates.

Another aspect of this invention is the use of alternating current (ac) frequency as a parameter for the sensitivity of the device. The device capacitance of the devices proposed in both FIG. 2 and FIG. 5 would show frequency dispersion according to the circuit models and also due to the frequency dispersion of the capacitances 404 and 505 in the respective models. In addition, the metal-dielectric-semiconductor capacitance 504, for the device of FIG. 5 is also expected to show frequency dispersion. Thus, the equivalent device capacitances for both the proposed devices are expected to show frequency dispersion. This frequency dispersion will result in different sensitivity of device capacitance to illumination intensity at different ac frequencies.

To summarize, in one aspect, this device's novelty lies in its architecture where two or more capacitive elements are being coupled by photosensitive element(s) which behave as a distributed network of resistances and capacitances and the resistances depend on the intensity of illumination while the capacitances depend on both the intensity of illumination and ac frequency of operation. These dependencies are leveraged in the proposed device to exhibit large dynamic range.

Figure 13:
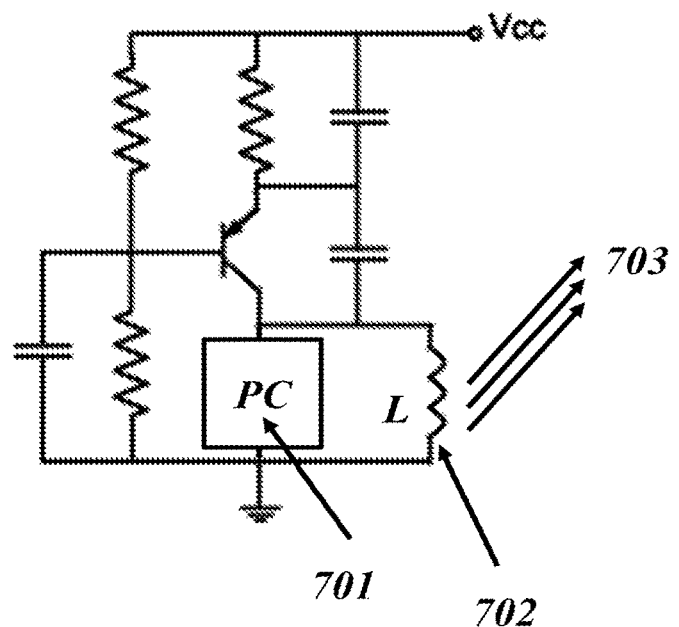
FIG. 13 depicts an RF (radio frequency) oscillator circuit according to embodiments of the invention.

Another aspect of the invention is the use of this device in an RF oscillator circuit (or the like) to produce a frequency modulated signal in response to incident light intensity modulation. An example of such a circuit and implementation is shown in FIG. 13. The devices demonstrated above can be installed in an oscillator circuit's tank as the capacitor 701 along with an inductor 702, to produce an RF signal 703, whose frequency is determined by the device capacitance of the device. This capacitance value is changed upon illumination causing a frequency shift. Hence, the signal 703, from this sensor could be treated as a frequency modulated signal representing the variation in intensity of incident light. This device, thus, does not need complex circuitry to process and wirelessly transmit the data.

Figure 14:
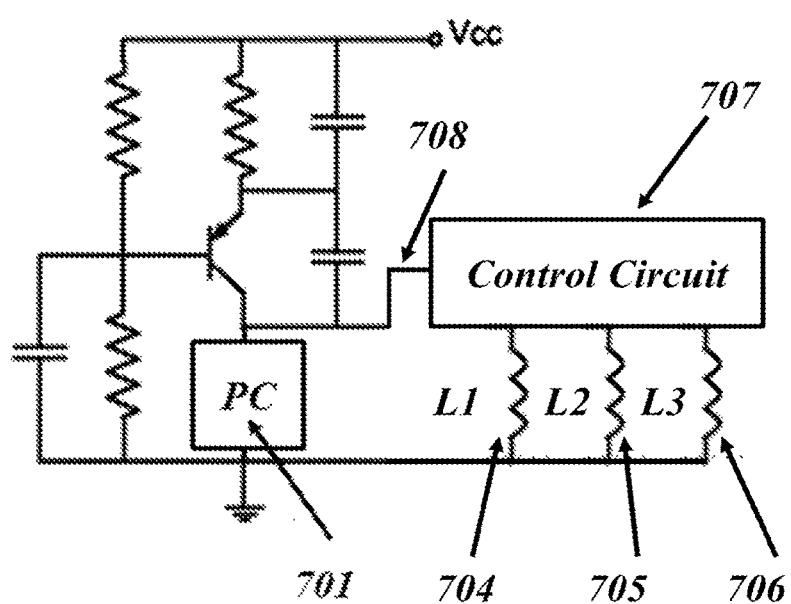
FIG. 14 depicts an RF circuit having a control circuit according to embodiments of the invention.

Another aspect of the invention is to have the inductance of the tank circuit as a variable and controllable by a control circuit 707, as shown in FIG. 14. The control circuit can switch between different inductances 704-706, and couple them to the capacitor at node 708. By changing values of the inductance, the frequency of oscillation can be changed and if the device capacitance exhibits frequency dispersion and shows different sensitivities at different frequencies, the sensitivity and the dynamic range of the device can be tuned.

Figure 15:
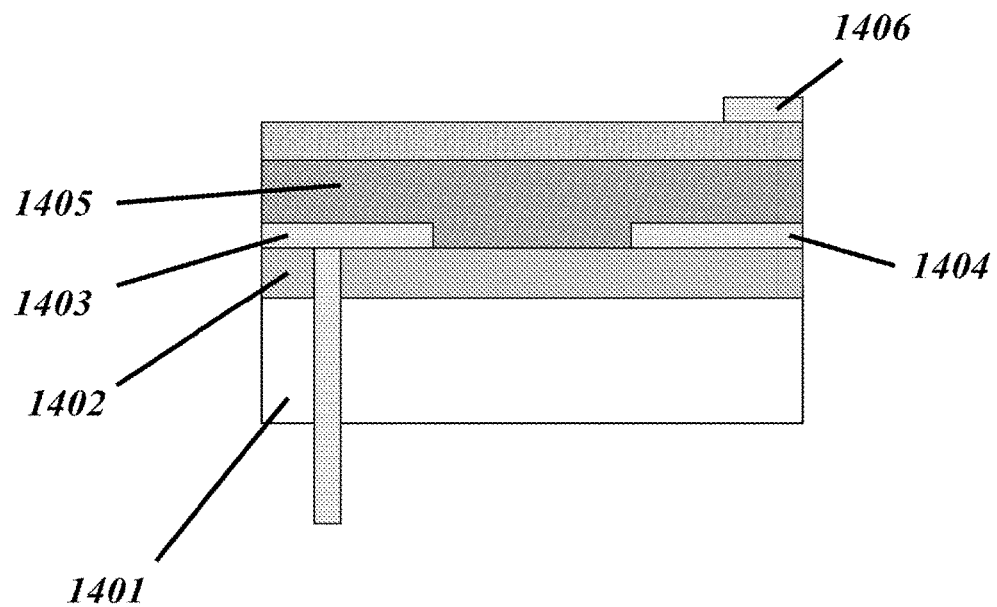
FIG. 15 depicts a device employing CdS (cadmium sulfide) as the active semiconductor layer according to embodiments of the invention.
Figure 16:
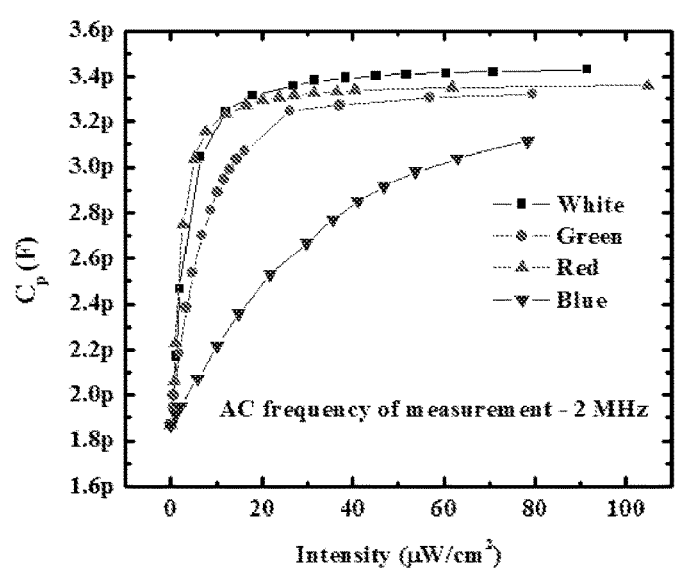
FIG. 16 depicts a plot showing capacitance upon illumination intensity for four different illumination sources according to embodiments of the invention.
Figure 17:
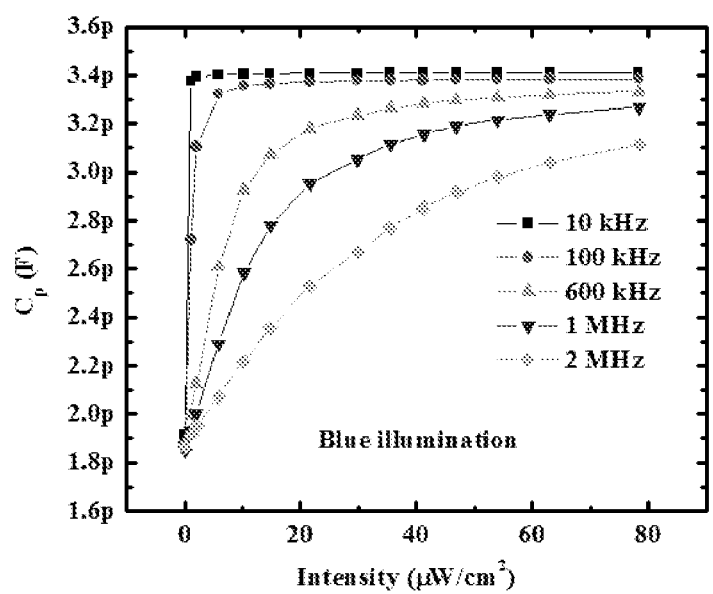
FIG. 17 depicts a plot showing capacitance upon illumination intensity for a system having tunable sensitivity and dynamic range based on ac frequency of operation.

As an example, a device employing CdS (cadmium sulfide) as the active semiconductor layer has been demonstrated. The device structure schematic is shown in FIG. 15. It employs a CdS film 1402 deposited on a substrate 1401. Metal pads are used for making the electrodes 1403 and 1404. A silicone based dielectric is used as to form the dielectric layer 1405. The top electrode is formed using a layer of ITO (tin doped indium oxide) to serve as transparent contact 1406. This is a three terminal structure where the capacitance of interest, $C_p$, is the capacitance between the electrodes 1406 and 1403. This capacitance is determined by the coupling of two geometric capacitances (C) via the semiconducting layer (resistance: $R_s$, dielectric capacitance: $C_s$) under illumination and the capacitance between the metal gate and the semiconductor ($C_d$), referring to the circuit model shown in FIG. 6. The lower and upper limits of the capacitance of interest are $$C\left(1 + \frac{C_s}{C + C_s}\right)$$

and ($2C+C_d$). The dependence of this capacitance upon illumination intensity for four different illumination sources is shown in FIG. 16. The device also shows tunable sensitivity and dynamic range based on ac frequency of operation as shown in FIG. 17. The device could be used intelligently by changing the frequency of operation for different dynamic ranges of interest. Furthermore, altering the geometry of source and drain, or introducing external capacitors between the gate and source and the gate and drain can alter the floor and the ceiling of capacitance values, respectively.

Figure 18:
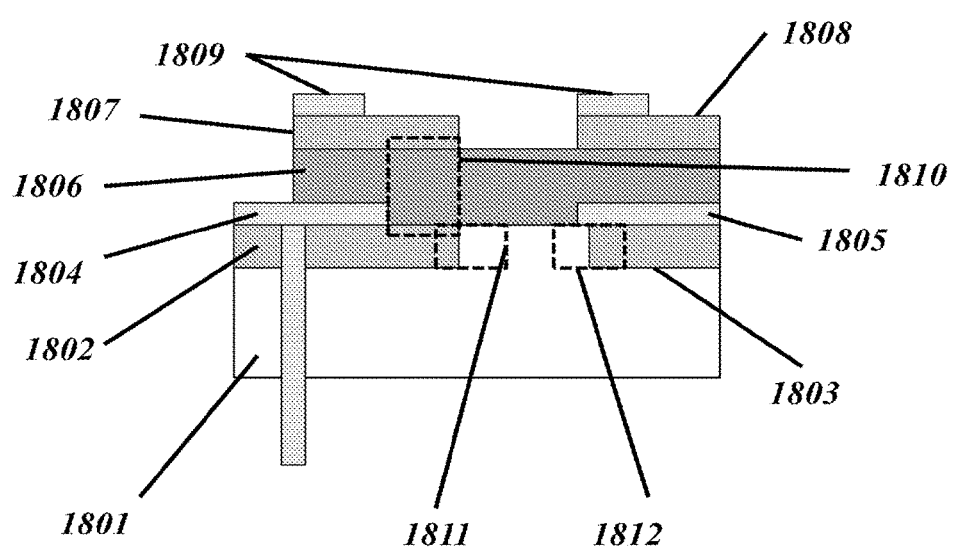
FIG. 18 depicts an alternative embodiment of a semiconductor structure according to embodiments of the invention.

FIG. 18 depicts a further embodiment of a semiconductor structure. In this case, the device employs a metal-oxide-semiconductor (MOS) capacitance and a semiconductor p-n junction. In the drawing 1801 represents a lightly doped P (or N) substrate and 1802 and 1803 represent wells of opposite doping. 1804 and 1805 represent metal pads which are (partly) used to form geometric capacitances. 1806 is a dielectric layer with transparent metal electrodes 1807 and 1808 deposited on top. 1809 are metal pads to facilitate connections to the transparent metal electrodes 1807 and 1808 which are kept at the same potential. The active region of the device is formed by the MOS capacitance 1810 between the transparent metal electrode and the well 1802, biased in inversion, and the PN junctions 1811 and 1812. The geometric capacitances formed by the overlap between 1807-1804 and 1808-1805 is coupled through the MOS capacitance 1810 and the light activated PN junctions 1811 and 1812. The overall impedance measured between 1809 and 1804 thus changes under illumination and shows frequency dispersion by virtue of the dispersion of the MOS capacitance 1810 and the coupling of the two geometric capacitances through the PN junctions 1811 and 1812.

Figure 19:
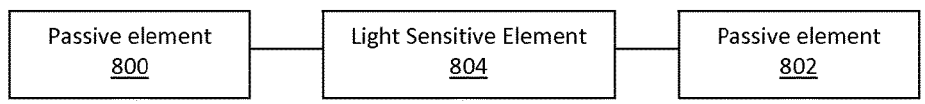
FIG. 19 depicts a simple sensor system according to embodiments of the present invention.
Figure 20:
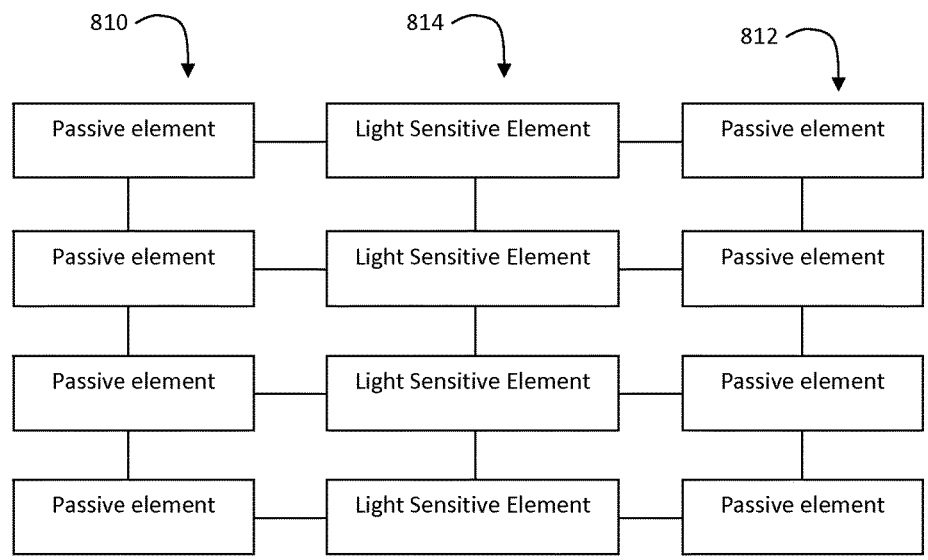
FIG. 20 depicts a network of the sensors according to embodiments of the present invention.
Figure 21:
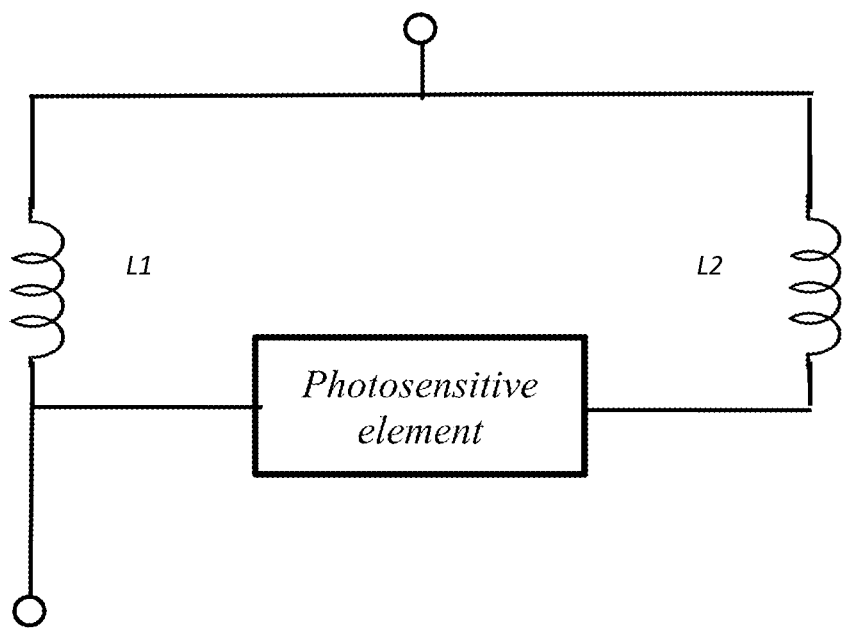
FIG. 21 depicts a circuit model of a sensor incorporating inductors according to embodiments of the present invention.
Figure 22:
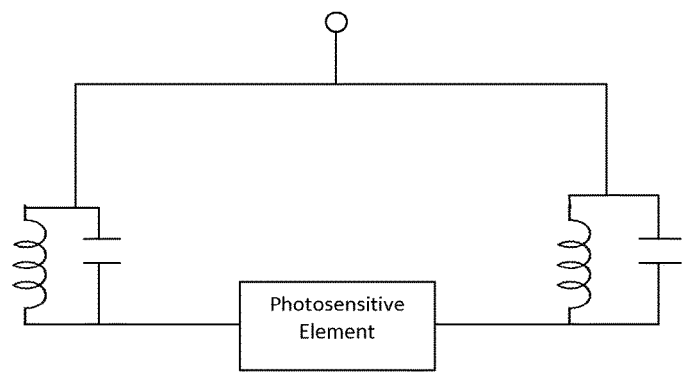
FIG. 22 depicts a circuit model of a sensor incorporating LC circuits according to embodiments of the present invention.

FIG. 19 depicts a basic overview of a sensor system having a light sensitive element 804 and a pair of passive elements 800, 802. For the purposes of this disclosure, a passive element is defined as an element allowing at least one connection and having a dominant reactive impedance, such as capacitive impedance or inductive impedance or the combination of thereof. FIG. 20 depicts a device structure network for converting a sensed illumination into corresponding position dependent impedance changes. In this case, a set of light sensitive elements 814 are utilized along with associated passive element pairs 810, 812. FIG. 21 depicts a circuit model of a sensor incorporating inductors and FIG. 22 depicts a circuit model of a sensor incorporating LC circuits.

Figure 23:
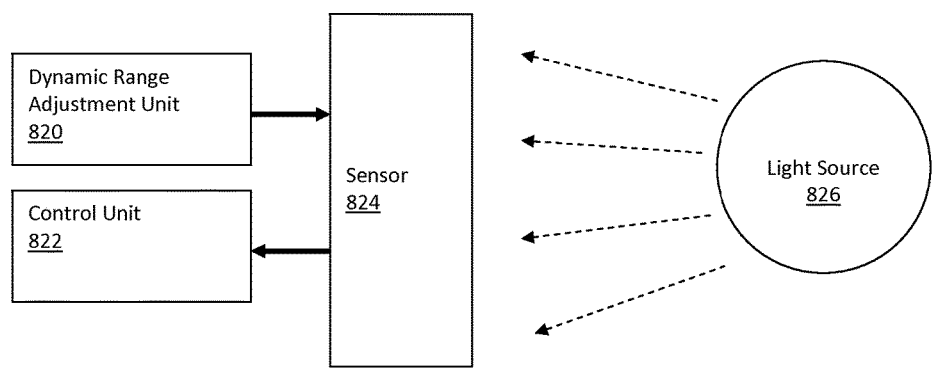
FIG. 23 depicts a sensor having both a control unit and a dynamic range adjustment unit to control and adjust the sensor dynamic range according to embodiments of the present invention.
Figure 24:
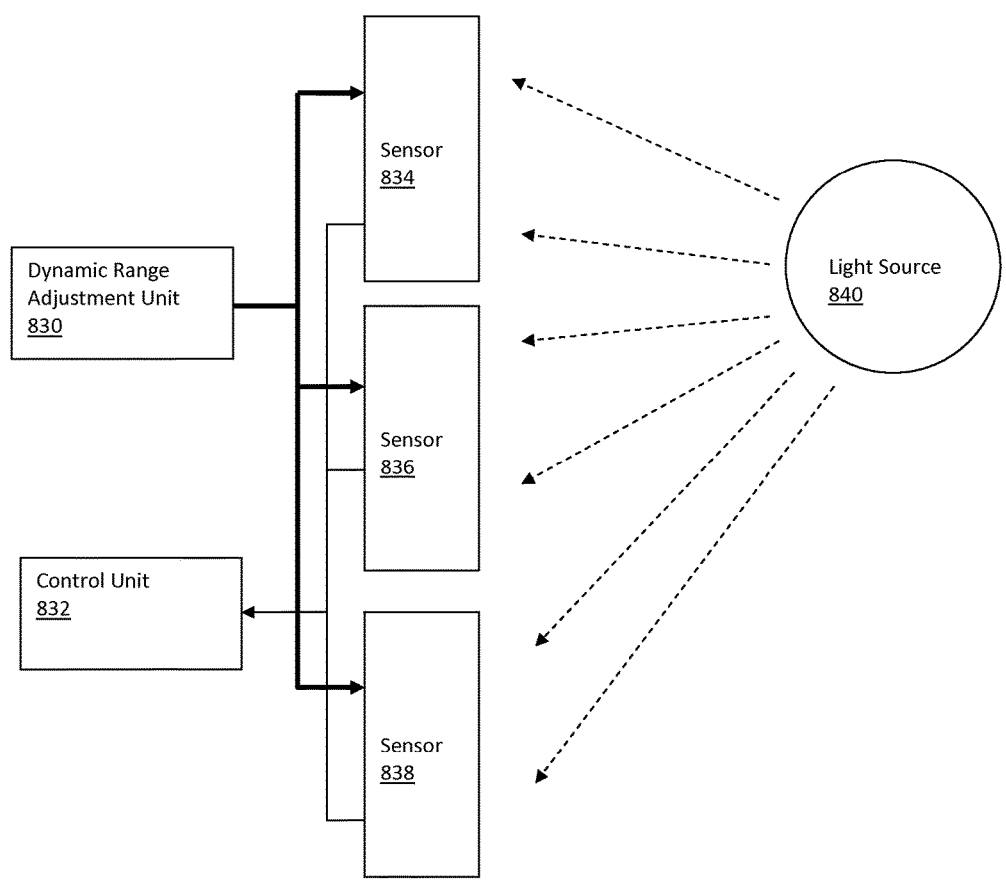
FIG. 24 depicts a network of sensors that can sense position dependent light distribution and incorporates a control unit and a dynamic range adjustment unit to control and adjust the sensor dynamic range according to embodiments of the present invention.

FIG. 23 depicts a sensor system having a sensor 824 for detecting illumination and a tuning system having one or both a dynamic range adjustment unit 820 (e.g., control circuit 509 of FIG. 8) and control unit 822 (e.g., control circuit 707 of FIG. 14) to control and adjust the sensor dynamic range. The dynamic range control unit 820 may control the dynamic range via, for example, changing the controlling voltage, such as the gate bias in the above described embodiment. In another embodiment, the tuning system may cause a voltage controlled shift of the Fermi quasi-level with respect to the density distribution of localized states. FIG. 24 shows a circuit incorporating a network of sensors. Such network could allow for achieving unprecedented dynamic rage via detecting up to a single photon at a very low modulation frequency and detecting a very high flux at a higher frequency and, therefore, at a higher speed.

In various illustrative embodiments, the invention may be embodied as: a photocapacitive optical sensor implemented by connecting two or more capacitive elements by a one or more photosensitive element; a sensor where at least one photosensitive element is a semiconductor or semiconductor structure; a sensor comprising a metal-dielectric-semiconductor capacitance formed with a semiconductor or semiconductor structure as a photosensitive element; a sensor where the semiconductor photosensitive structure is monolithically integrated with the capacitive structures it connects; a sensor where the photosensitive semiconductor is Si, Ge, SiC, SiGe, AlSb, AlAs, AlN, AlP, BN, BP, BAs, GaSb, GaAs, GaN, GaP, InSb, InAs, InN, InP, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, HgCdTe, HgZnTe, HgZnSe, CuCl, $Cu_2S$, PbSe, PbS, PbTe, SnS, $SnS_2$, $Cd_3As_2$, $TiO_2$, $Cu_2O$, CuO, $SnO_2$, $BaTiO_3$, $SrTiO_3$, $LiNbO_3$, $La_2CuO_4$, GaSe, SnS, $Bi_2S_3$, GaMnAs, InMnAs, CdMnTe, PbMnTe, FeO, NiO, $AgGaS_2$, $ZnSiP_2$, $As_2S_3$, PtSi, $BiI_3$, $HgI_2$, TlBr, Se, $Ag_2S$, $FeS_2$, single layer or multi layer graphene, single layer or multi layer two dimensional material, MoS2, and $FeS_2$ in a crystalline or amorphous form and materials alloyed with hydrogen or fluorine or the combination of thereof, etc.; a sensor where the photosensitive element is a semiconductor heterostructure; a sensor where the photosensitive semiconductor structure contains an amorphous semiconductor; a sensor where the photosensitive semiconductor structure contains an microcrystalline semiconductor; a sensor where the photosensitive semiconductor structure contains an polycrystalline semiconductor; a sensor where the photosensitive semiconductor structure contains a nano crystalline semiconductor; a sensor where the photosensitive semiconductor structure contains embedded metal nanoparticles; a sensor where the photosensitive semiconductor structure contains embedded nanodots; a sensor formed on a flexible substrate; a sensor with external capacitors added to it through controlling circuits, which can be used to change the lower and upper limit of the device capacitance and hence the resolution of the sensor; an oscillator circuit comprising sensors in a tank circuit; and/or a controlling circuit that changes the inductance value in the tank circuit to implement a change in ac frequency of operation and hence a change in sensitivity and dynamic range of the sensor.

Further, illustrative sensing applications of the sensor include, but are not limited to: visible light, x-rays, gamma rays, infrared rays, cosmic rays, bio-, chemi-, thermal luminescence, phosphorescence and fluorescence from any object. Applications of the sensors include, but are not limited to: lighting system control, imaging, surveillance, atmospheric monitoring, factory automation, medical diagnostics, personal health care, data communication nodes, computing elements, agricultural systems, transportation systems, safety devices, deep space, underground, underwater applications such as in satellites, UAVs, coal mines, oceans, submarines, etc.

Features of the disclosed system include the following:
1. The dynamic range of the human eye is over 140 dB (close to 200 dB), while current CMOS sensors have a range of 60-70 dB. The described photocapacitive optical sensor design enables a dynamic range exceeding that of the current technologies.
2. Due to its inherent radio wave emission (with input optical signal), this device can be operated in a remote location and in a wireless and ubiquitous mode.
3. The characteristics of the radio wave (such as frequency) can be tuned to represent the intensity, wavelength or the modulation speed of the optical signal incident on the sensor.
4. This device can be made to be self powered using, e.g., either photovoltaic mode or by wind harvesting.
5. This device can be made compact using standard integrated circuit (IC) processing technology.
6. This device can me made extremely low cost compared to standard CMOS devices due to its simplicity in the design.
7. Impedance modulation by light changing the frequency response.
8. Dynamic range and/or spectral sensitivity is tunable by changing the modulation frequency of the impedance.
9. One mechanism of such tuning is the voltage controlled shift of the Fermi quasi-level with respect to the density distribution of localized states.
10. Monolithic design for conversion of sensor time response into frequency response for unprecedented improvement in signal to noise ratio.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An optical sensor system, comprising:
    at least one photosensitive element; and
    at least two passive elements connected via the at least one photosensitive element;
    wherein each passive element outputs a measurable impedance response based on a characteristic of a light source striking the at least one photosensitive element; and
    wherein the at least two passive elements and the at least one photosensitive element are formed as a monolithic semiconductor structure having a common semiconductor layer,
    wherein a pair of the at least two passive elements are spatially formed as stacks on the common semiconductor layer with metal and dielectric layers, and the at least one photosensitive element comprises a portion of the common semiconductor layer between the pair of passive elements.

2. The optical sensor system of claim 1, wherein each passive element is a capacitive element formed from a metal-dielectric-semiconductor structure.

3. The optical sensor system of claim 2, wherein each capacitive element includes a metal electrode.

4. The optical sensor system of claim 3, further comprising a control circuit adapted to change a lower and an upper capacitance limit of at least one capacitive element in order to alter a resolution of the optical sensor system.

5. The optical sensor system of claim 1, further comprising a reactive element for providing at least one of an inductance or capacitance, coupled to at least one of the passive elements to form a tank circuit to generate a wireless signal having a frequency that depends upon a characteristic of the light source striking the photosensitive element.

6. The optical sensor system of claim 5, further comprising a control circuit for changing a resonant frequency of the tank circuit to implement a change in ac frequency of operation and hence a change in sensitivity and dynamic range of the optical sensor system.

7. The optical sensor system of claim 1, wherein the semiconductor structure is selected from a group consisting of: Si, Ge, SiC, SiGe, AlSb, AlAs, AlN, AlP, BN, BP, BAs, GaSb, GaAs, GaN, GaP, InSb, InAs, InN, InP, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, HgCdTe, HgZnTe, HgZnSe, CuCl, $Cu_2S$, PbSe, PbS, PbTe, SnS, $SnS_2$, $Cd_3As_2$, $TiO_2$, $Cu_2O$, CuO, $SnO_2$, $BaTiO_3$, $SrTiO_3$, $LiNbO_3$, $La_2CuO_4$, GaSe, $Bi_2S_3$, GaMnAs, InMnAs, CdMnTe, PbMnTe, FeO, NiO, $AgGaS_2$, $ZnSiP_2$, $As_2S_3$, PtSi, $BiI_3$, $HgI_2$, TlBr, Se, $Ag_2S$, single layer or multi layer graphene, single layer or multi layer two dimensional material, MoS2, and FeS2 in a crystalline or amorphous form and materials alloyed with hydrogen or fluorine or any combination of the foregoing.

8. The optical sensor system of claim 1, wherein the at least one photosensitive element comprises a semiconductor heterostructure.

9. The optical sensor system of claim 1, wherein the semiconductor structure includes at least one of: an amorphous semiconductor, a microcrystalline semiconductor, a polycrystalline semiconductor, a nano crystalline semiconductor, embedded metal nanoparticles, and embedded nanodots.

10. The optical sensor system of claim 3, wherein the monolithic structure is formed on a flexible substrate.

11. A sensor, comprising:
a network of photosensitive elements;
pairs of passive elements, each pair connected via one of said photosensitive elements for converting a sensed illumination detected by the photosensitive element into a corresponding impedance response; and
a wireless signal generator that generates a wireless output comprising a data transmission based on a characteristic of the corresponding impedance response, wherein information in the data transmission correlates to the sensed illumination.

12. The sensor of claim 11, further comprising a tuning system for changing a modulation frequency of the corresponding impedance response to alter a dynamic range of the sensor.

13. The sensor of claim 12, wherein the tuning system causes a voltage controlled shift of a Fermi quasi-level with respect to a density distribution of localized states.

14. The sensor of claim 11, wherein the photosensitive elements and passive elements are formed in a monolithic semiconductor based structure having a common semiconductor layer,
wherein a pair of the pairs of passive elements are spatially formed as stacks on the common semiconductor layer with metal and dielectric layers, and at least one of the network of photosensitive elements comprises a portion of the common semiconductor layer between the pair of passive elements.

15. The sensor of claim 14, wherein each pair of passive elements comprises a pair of capacitive element.

16. The sensor of claim 15, further comprising a control circuit adapted to change an impedance limit of at least one capacitive element in order to alter a resolution of the sensor.

17. The sensor of claim 14, wherein the monolithic semiconductor based structure is formed on a flexible substrate.

18. A method for implementing a sensor, comprising:
providing at least one photosensitive element;
providing at least one pair of impedance elements coupled via the at least one photosensitive element;
providing a wireless signal generator that integrates with at least one of the impedance elements;
generating an impedance response on each impedance element in response to a sensed illumination detected by the at least one photosensitive element; and
generating a wireless output comprising a data transmission from the wireless signal generator based on a characteristic of the impedance, wherein information in the data transmission correlates to the sensed illumination;
wherein the impedance elements comprise capacitive elements, and wherein the capacitive elements and at least one photosensitive element are integrated into a monolithic semiconductor structure having a common semiconductor layer,
wherein a pair of the at least one pair of impedance elements are spatially formed as stacks on the common semiconductor layer with metal and dielectric layers, and the at least one photosensitive element comprises a portion of the common semiconductor layer between the pair of impedance elements.

* * * * *